United States Patent
Ito

(10) Patent No.: US 8,421,450 B2
(45) Date of Patent: Apr. 16, 2013

(54) CURRENT DETECTION DEVICE

(75) Inventor: Kohei Ito, Nagoya (JP)

(73) Assignee: Aisin AW Co., Ltd., Anjo (JP)

( * ) Notice: Subject to any disclaimer, the term of this patent is extended or adjusted under 35 U.S.C. 154(b) by 289 days.

(21) Appl. No.: 13/041,835

(22) Filed: Mar. 7, 2011

(65) Prior Publication Data

US 2011/0221430 A1 Sep. 15, 2011

(30) Foreign Application Priority Data

Mar. 9, 2010 (JP) .................................. 2010-052227

(51) Int. Cl.
*G01R 33/02* (2006.01)
*G01R 15/20* (2006.01)

(52) U.S. Cl.
USPC ............... 324/244; 324/117 H; 324/117 R

(58) Field of Classification Search .............. 324/117 H, 324/117 R, 244
See application file for complete search history.

(56) References Cited

U.S. PATENT DOCUMENTS

| | | | |
|---|---|---|---|
| 6,459,255 B1 | 10/2002 | Tamai et al. | |
| 7,626,376 B2 * | 12/2009 | Muraki et al. | 324/117 R |
| 7,898,240 B2 * | 3/2011 | Shibahara et al. | 324/117 R |
| 2006/0082357 A1 | 4/2006 | Tsukamoto | |

FOREIGN PATENT DOCUMENTS

| | | |
|---|---|---|
| JP | A-2001-074783 | 3/2001 |
| JP | A-2004-61217 | 2/2004 |
| JP | A-2006-112968 | 4/2006 |
| JP | A-2009-020085 | 1/2009 |
| JP | A-2010-008315 | 1/2010 |

OTHER PUBLICATIONS

Apr. 26, 2011 International Search Report issued in PCT/JP2011/053985 (with translation).

* cited by examiner

*Primary Examiner* — Bot Ledynh
(74) *Attorney, Agent, or Firm* — Oliff & Berridge, PLC

(57) ABSTRACT

A current detection device that detects a current flowing through a target bus bar based on a magnetic flux in the periphery of the target bus bar, the target bus bar being at least one of a plurality of bus bars arranged in parallel. An adjacent bus bar is configured by including a first extending section that is arranged on a first direction side on one side of an orthogonal direction with respect to a magnetic flux detection plane, and extends in a first extending direction parallel to a magnetic flux detection plane, and a second extending section that is bent at one end portion of the first extending section in the first extending direction toward the first direction side, and extends in a second extending direction that crosses the magnetic flux detection plane. A detection portion of the target bus bar overlaps with the first extending section.

19 Claims, 9 Drawing Sheets

CURRENT DETECTION DEVICE

INCORPORATION BY REFERENCE

The disclosure of Japanese Patent Application No. 2010-052227 filed on Mar. 9, 2010 including the specification, drawings and abstract is incorporated herein by reference in its entirety.

BACKGROUND OF THE INVENTION

The present invention relates to a current detection device that detects a current flowing through a conductor by using a hall effect.

DESCRIPTION OF THE RELATED ART

Recently, electric vehicles driven by a rotary electric machine, and hybrid vehicles driven by an internal combustion engine and a rotary electric machine have been in practical use. In the rotary electric machine used in a driving device for such vehicles, a current is supplied through a thick and highly rigid conductor (conductor made of metals such as copper or aluminum) called a bus bar. In most cases, the rotary electric machine is feedback-controlled based on a detection result of a current supplied to the rotary electric machine. The current is measured by, for example, a current sensor that obtains a current value by detecting a magnetic flux generated by the current with magnetic detection elements such as a hall element. The magnetic flux is generated in a manner orbiting around a current path according to the right-hand screw rule. Thus, detection accuracy has been enhanced by arranging a conductor serving as a current path in an annular magnetic flux-concentrating core, and collecting a magnetic flux generated by the current flowing through the current path with the flux-concentrating core. For example, a three-phase alternating current rotary electric machine includes current paths for a plurality of phases. Therefore, a magnetic flux may also be generated by a current flowing through a bus bar other than a target bus bar, which is the target for current detection, and cause magnetic interference. Such magnetic interference can be suppressed by providing a flux-concentrating core.

In combination with the need to downsize vehicles and reduce their costs, there are also demands to downsize current sensors, as well as reduce their costs and number of components. Therefore, coreless current sensors that have no flux-concentrating core orbiting around a bus bar have been put to practical use. An example of such a coreless current sensor is disclosed in Japanese Patent Application Publication No. JP-A-2004-61217 (e.g. paragraphs [0002], [0003], [0019], and FIG. 2). In this coreless current sensor, a countermeasure is necessary to prevent magnetic interference caused by a magnetic flux that is generated by a current flowing through a bus bar other than a target bus bar. For example, a coreless current sensor (current detection device) as described below is disclosed in Japanese Patent Application Publication No. JP-A-2006-112968 (e.g. paragraphs [0036] to [0041], and FIGS. 2 and 3). In such a current detection device, for example, three bus bars arranged parallel to one another serve as the target bus bars, and the device includes three current sensors that detect the current flowing through the bus bars. The current detection device also includes magnetic shields attached to the bus bars. The three current sensors are arranged, on the three bus bars arranged in parallel, at positions alternately shifted along the bus bars. Also, the magnetic shields attached to the bus bars are arranged at positions alternately shifted along the bus bars. The plurality of magnetic shields and the plurality of current sensors are arranged in a staggered grid pattern, and therefore, magnetic interference from an adjacent bus bar acting on the current sensors can be suppressed.

SUMMARY OF THE INVENTION

With the current detection device disclosed in JP-A-2006-112968, however, it is necessary to provide magnetic shields in the respective bus bars. This complicates the configuration of the device accordingly, in addition to increasing the number of manufacturing steps and increasing the manufacturing cost.

It is thus desirable to realize, with a simple configuration and at low cost, a current detection device capable of detecting a current with high accuracy by suppressing an effect of a magnetic field from an adjacent bus bar when a plurality of bus bars is arranged in parallel.

A current detection device according to the present invention detects a current flowing through a target bus bar based on a magnetic flux in the periphery of the target bus bar, the target bus bar being at least one of a plurality of bus bars arranged in parallel. The current detection device has a constitution characterized in that a sensor unit that detects a magnetic flux in a predetermined magnetic flux detection direction includes no flux-concentrating core that orbits around the target bus bar, the sensor unit being arranged near a detection portion of the target bus bar so that the magnetic flux detection direction and a detection portion extending direction that is the extending direction of the target bus bar at the detection portion achieve an orthogonal state; a plane that is parallel to the detection portion extending direction and includes the magnetic flux detection direction is a magnetic flux detection plane, and a bus bar arranged adjacent to the target bus bar among the plurality of bus bars is an adjacent bus bar; the adjacent bus bar is configured by including a first extending section that is arranged on a first direction side on one side of an orthogonal direction with respect to the magnetic flux detection plane, and extends in a first extending direction parallel to the magnetic flux detection plane, and a second extending section that is bent at one end portion of the first extending section in the first extending direction toward the first direction side, and extends in a second extending direction that crosses the magnetic flux detection plane; and the detection portion of the target bus bar is set at an overlapping location that overlaps with the first extending section in the first extending direction.

Here, the "orthogonal state" refers to a crossed state that allows a deviation from orthogonal of ±45° or less. "Overlapping" in a particular direction refers to a layout in that particular direction that includes at least a portion in which two targets (members) are at the same position. In other words, when seen from a direction orthogonal to that particular direction, there exists a point at which the two targets (members) overlap each other. In the present specification, a state where the sensor unit is arranged near the detection portion of the target bus bar refers to a state where the sensor unit is arranged in contact with the detection portion of the target bus bar, or a state where the sensor unit is arranged a predetermined distance apart from the detection portion. Here, the predetermined distance is set within a distance in which the sensor unit is capable of detecting a magnetic field generated from the target bus bar.

According to the constitution characterized as described above, the magnetic field generated by the current flowing through the first extending section extending in the first extending direction parallel to the magnetic flux detection plane, and the magnetic field generated by the current flowing through the second extending section crossing the magnetic flux detection plane, both of which are magnetic fields generated by the current flowing through the adjacent bus bar, cancel out each other at the sensor unit. That is, the magnetic flux densities based on the first extending section and the second extending section having different current flowing directions are cancelled out so that the magnetic interference at the sensor unit is suppressed. There is no need to provide a specific magnetic shield for the adjacent bus bar and the target bus bar, and there is also no need to provide a flux-concentrating core that orbits around the target bus bar. The magnetic interference at the sensor unit can be suppressed simply by defining the shape of the adjacent bus bar in the extending direction, and by defining the positional relationship of the detection portion of the target bus bar with respect to the adjacent bus bar. That is, with the constitution characterized as described above, a current detection device capable of performing current detection with high accuracy by suppressing an effect of the magnetic field from the adjacent bus bar even if the plurality of bus bars is arranged in parallel can be realized with a simple configuration and at low cost.

Also, in the current detection device according to the present invention, it is preferable that the adjacent bus bar that is configured by including the first extending section and the second extending section further includes a third extending section that is bent at another end portion of the first extending section in the first extending direction toward a second direction side on another side of the orthogonal direction with respect to the magnetic flux detection plane, and extends in a third extending direction that crosses the magnetic flux detection plane; and the overlapping location is arranged on the third extending section side of a center location of the first extending section in the first extending direction. As described above, the magnetic field based on the first extending section that is parallel to the magnetic flux detection plane, and the magnetic field based on the second extending section that crosses the magnetic flux detection plane cancel out each other at the sensor unit, and therefore, the magnetic interference at the sensor unit is suppressed. On the other hand, the magnetic field based on the third extending section that crosses the magnetic flux detection plane similar to the second extending section has the same direction component as the magnetic field based on the first extending section at the sensor unit. Because the overlapping location where the detection portion of the target bus bar overlaps the first extending section of the adjacent bus bar is arranged on the third extending section side of the center location in the first extending direction, an angle formed by the magnetic flux (magnetic flux based on the third extending section) direction at the sensor unit and the magnetic flux detection direction becomes nearly orthogonal. Therefore, the sensor unit is less affected. Meanwhile, because the second extending section becomes farther from the sensor unit, the magnetic flux direction at the sensor unit becomes closer to the magnetic flux detection direction. As a result, a proportion of the component that enables the magnetic flux based on the second extending section to cancel out the magnetic flux based on the first extending section at the sensor unit increases, and therefore, the magnetic interference is suppressed. Also, the adjacent bus bar continuing through the third extending section, the first extending section, and the second extending section has a stepped configuration. Therefore, space can be efficiently used, for example, when routing the bus bar around other members.

It is also preferable that, in the current detection device of the present invention, the adjacent bus bar configured by including the first extending section and the second extending section further includes a third extending section that is bent at another end portion of the first extending section in the first extending direction toward the first direction side, and extends in a third extending direction that crosses the magnetic flux detection plane; and the overlapping location is arranged at a center location of the first extending section in the first extending direction. Accordingly, the magnetic field based on the first extending section that is parallel to the magnetic flux detection plane and the magnetic fields based on the second extending section and the third extending section that cross the magnetic flux detection plane cancel out each other's magnetic fluxes at the sensor unit. Therefore, the magnetic interference at the sensor unit is suppressed. More specifically, the magnetic fields based on both the second extending section and the third extending section can suppress the magnetic field based on the first extending section, whereby the magnetic fields can be more reliably cancelled out. Also, because the overlapping location where the detection portion of the target bus bar and the first extending section of the adjacent bus bar overlap is arranged at the center location in the first extending direction, the magnetic fields based on the second extending direction and the third extending direction can be evenly utilized, and a vector analysis can also be easily performed. In addition, the adjacent bus bar of a straight bus bar, for example, can be configured such that the second extending section and the third extending section are used as legs, and the first extending section is used as a top. This makes modifications and production easier.

Here, the first extending direction and the second extending direction are preferably orthogonal. Alternatively, the detection portion extending direction and the first extending direction are preferably parallel to each other. Naturally, the first extending direction and the second extending direction may be orthogonal and the detection portion extending direction and the first extending direction may be parallel to each other. This facilitates the vector analysis of the magnetic field based on the current flowing through the first extending section that extends in the first extending direction and the second extending section that extends in the second extending direction, and a constitution in which the magnetic interference is suppressed can be easily configured. Also, space for arranging the bus bars can be effectively used. When using three or more bus bars in particular, the layout does not become complex and space can be effectively used.

It is also preferable that each of the plurality of bus bars has an identical shape. The magnetic fields generated by the currents flowing through the bus bars thus become similar, and a constitution in which the magnetic interference is suppressed by vector analysis can be easily configured. Giving each of the plurality of bus bars an identical shape also contributes to a reduction in the cost of the bus bar member.

Preferably, the detection portion of the target bus bar is arranged on the first direction side with respect to the magnetic flux detection plane. If the detection portion is arranged on the first direction side with respect to the magnetic flux detection plane, the target bus bar and the adjacent bus bar can be arranged adjacent on one side of the magnetic flux detection plane, whereby the plurality of bus bars can be efficiently arranged.

DETAILED DESCRIPTION OF THE EMBODIMENTS

Figure 1:
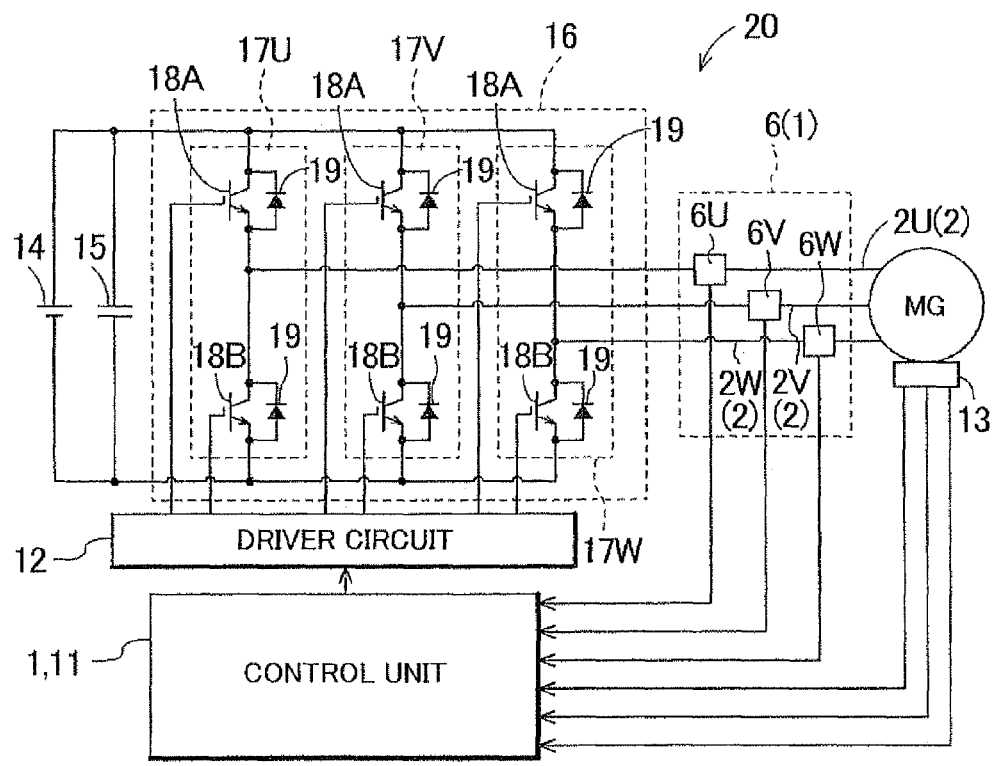
FIG. 1 is a schematic view of a configuration example of a driving device of a rotary electric machine.

Hereinafter, a current detection device that detects a driving current (power generation current) of an alternating current rotary electric machine will be explained as an example of an embodiment of the present invention. In the present embodiment, as shown in FIG. 1, a current detection device 1 is applied to a driving device 20 of a rotary electric machine MG driven by a three-phase alternating current. The current detection device 1 is arranged near bus bars (conductors) 2U, 2V, and 2W through which driving currents (power generation currents) of the three phases of U-phase, V-phase, and W-phase flow, respectively. The bus bars 2U, 2V, and 2W supply driving currents when the rotary electric machine MG functions as an electric motor, and regenerate power generation currents when the rotary electric machine MG functions as a power generator. In the description below, "bus bar 2" collectively refers to the U-phase bus bar 2U, the V-phase bus bar 2V, and the W-phase bus bar 2W.

As shown in FIG. 1, the driving device 20 is configured by including a control unit 11, a driver circuit 12, a rotation detection device 13, a direct current power source 14, a smoothing capacitor 15, and an inverter 16. The direct current power source 14 is a chargeable secondary cell such as a battery. The driving device 20 converts the direct current power of the direct current power source 14 into a three-phase alternating current of a predetermined frequency, and supplies it to the rotary electric machine MG. Also, the driving device 20 converts the alternating current power generated by the rotary electric machine MG into a direct current, and supplies it to the direct current power source 14. The rotation detection device 13 is configured of, for example, a resolver, and outputs detection signals of the rotational speed of the rotary electric machine MG and the rotational location of a rotor to the control unit 11. The smoothing capacitor 15 is coupled in parallel between a positive electrode terminal and a negative electrode terminal of the direct current power source 14, and smoothes the voltage of the direct current power source 14.

The inverter 16 is configured by including a plurality of switching elements. An insulated gate bipolar transistor (IGBT) or a metal oxide semiconductor field effect transistor (MOSFET) is preferably applied as the switching element. In the present embodiment, the IGBT is used for each switching element as shown in FIG. 1. The inverter 16 includes a U-phase leg 17U, a V-phase leg 17V, and a W-phase leg 17W corresponding to the phases (three phases of U-phase, V-phase, and W-phase) of the rotary electric machine MG. Each of the legs 17U, 17V, and 17W includes a set of two switching elements configured by an IGBT 18A of the upper arm and IGBT 18B of the lower arm that are serially coupled. A flywheel diode 19 is coupled in parallel to each of the IGBTs 18A and 18B.

The U-phase leg 17U is coupled to a U-phase coil of the rotary electric machine MG through the U-phase bus bar 2U, the V-phase leg 17V is coupled to a V-phase coil of the rotary electric machine MG through the V-phase bus bar 2V, and the W-phase leg 17W is coupled to a W-phase coil of the rotary electric machine MG through the W-phase bus bar 2W. In this case, each of the bus bars 2U, 2V, and 2W electrically couples a point between the emitter of the IGBT 18A of the upper arm and the collector of the IGBT 18B of the lower arm of each of the legs 17U, 17V, and 17W and the respective phase coils of the rotary electric machine MG. The collector of the IGBT 18A of the upper aim of each of the legs 17U, 17V, and 17W is coupled to the positive electrode terminal of the direct current power source 14, and the emitter of the IGBT 18B of the lower arm of each of the legs 17U, 17V, and 17W is coupled to the negative electrode terminal of the direct current power source 14.

The inverter 16 is coupled to the control unit 11 through the driver circuit 12, and performs a switching operation in response to a control signal generated by the control unit 11. The control unit 11 is configured as an electronic control unit (ECU) having as its core a logic circuit of, for example, a microcomputer 1 not shown in the drawing. If the rotary electric machine MG is a driving device of a vehicle or the like, the direct current power source 14 provides a high voltage, and each of the IGBTs 18A and 18B of the inverter 16 switches a high voltage. As described above, the electrical potential difference between the high level and the low level of a pulsed gate driving signal input to the gate of the IGBT switching a high voltage is fairly larger than an operating voltage of a general electric circuit of, for example, microcomputers. Thus, the gate driving signal is voltage-converted and insulated through the driver circuit 12, and then input to each of the IGBTs 18A and 18B of the inverter 16.

When the rotary electric machine MG functions as an electric motor (during power running operation), the inverter 16 converts the direct current power from the direct current power source 14 into a three-phase alternating current power of a predetermined frequency and current value, and supplies it to the rotary electric machine MG. When the rotary electric machine MG functions as a power generator (during regeneration operation), the inverter 16 converts the three-phase alternating current power generated by the rotary electric machine MG into direct current power, and supplies it to the direct current power source 14. The rotary electric machine MG is controlled by the control unit 11 to have a predetermined output torque and rotational speed. In this case, the value of the current flowing through the stator coils (U-phase coil, V-phase coil, and W-phase coil) of the rotary electric machine MG is fed back to the control unit 11. Then, the control unit 11 controls the rotary electric machine MG by implementing a proportional-integral control (PI control) or a proportional integral differential control (PID control) in accordance with a deviation with respect to the target current. Thus, the current detection device 1 detects the current values of the phase bus bars 2U, 2V, and 2W arranged between the phase legs 17U, 17V, and 17W of the inverter 16 and the phase coils of the rotary electric machine MG.

In the present embodiment, the current detection device 1 is configured by including a sensor unit 6 provided for each of the three bus bars 2U, 2V, and 2W. More specifically, the current detection device 1 includes a U-phase sensor unit 6U for detecting a current of the U-phase bus bar 2U, a V-phase sensor unit 6V for detecting a current of the V-phase bus bar 2V, and a W-phase sensor unit 6W for detecting a current of the W-phase bus bar 2W. The phase sensor units 6U, 6V, and 6W detect a magnetic flux density of a magnetic field generated by a current flowing through the detection-targeted phase bus bars 2U, 2V and 2W, and output a detection signal corresponding to the detected magnetic flux density of the magnetic field. The magnetic flux density of a predetermined location of the magnetic field generated by the current flowing through the bus bar 2 is proportional to the size of the current flowing through the bus bar 2. Thus, the current values of the phase bus bars 2U, 2V, and 2W can be detected by using the phase sensor units 6U, 6V, and 6W. In the present embodiment, the control unit 11 also functions as the current detection device 1, and calculates the current value based on the magnetic flux density detected by the phase sensor units 6U, 6V, and 6W. Naturally, a configuration in which a calculation circuit is provided in each phase together with the sensor unit 6, and the current value independently obtained for each phase is input to the control unit is also acceptable. Also, because the current of each of the three phases is balanced and the instantaneous value is zero, a configuration in which the current values of only two phases are detected may be used.

Figure 19:
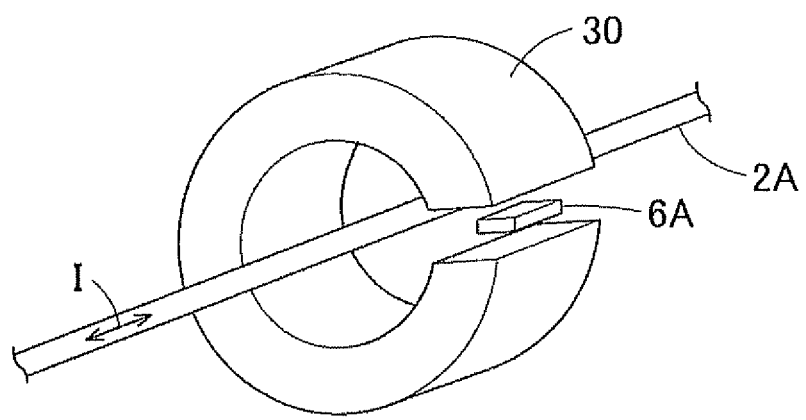
FIG. 19 is a perspective view schematically showing a principle of a current detection using a flux-concentrating core that orbits around a conductor.

The arrangement of the phase bus bars 2U, 2V, and 2W and the phase sensor units 6U, 6V, and 6W, and the configuration of the phase sensor units 6U, 6V, and 6W are similar to each other, and the explanation below simply refers to them as the bus bar 2 and the sensor unit 6, accordingly. The sensor unit 6 is not provided with a flux-concentrating core 30 as shown in FIG. 19, that is, a flux-concentrating core 30 that is a magnetic body collecting a magnetic flux and orbits around a conductor 2A such as a bus bar. The flux-concentrating core 30 is a magnetic core having a C-shaped cross section with a gap, and converges a magnetic flux generated by a current flowing through the conductor 2A to guide it to a sensor unit 6A arranged in the gap. Thus, the current detection device 1 of the present embodiment is a so-called coreless current detection device, and the sensor unit 6 is configured without a flux-concentrating core that orbits around a conductor. Moreover, a sensor device integrating, for example, a hall element and a magnetic body that changes the direction of a magnetic flux or locally concentrates a magnetic flux is also in practical use. A configuration in which such a sensor device is used as the sensor unit 6 will be considered a coreless current detection device here, provided that the configuration does not have a flux-concentrating core that orbits around a conductor.

Figure 2:
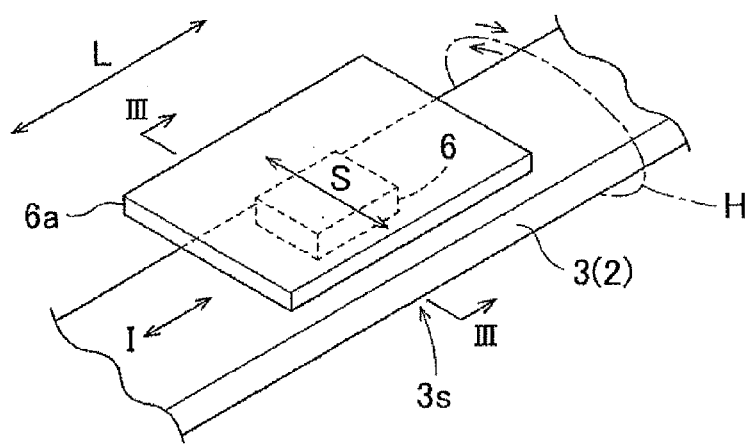
FIG. 2 is a perspective view of a schematic example of a positional relationship between a target bus bar and a sensor unit.
Figure 3:
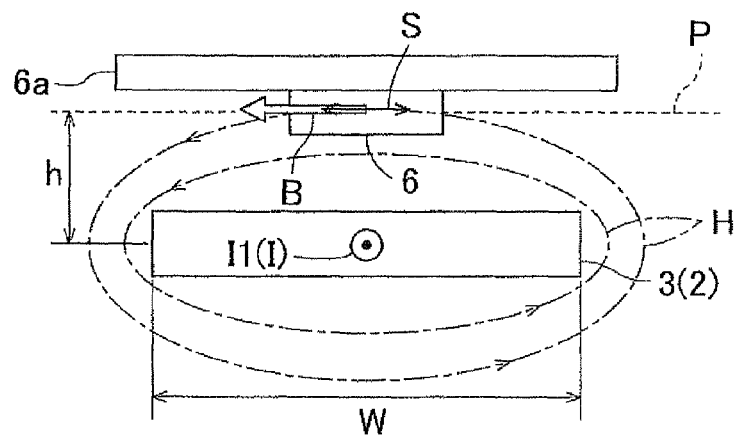
FIG. 3 is a view explaining a magnetic flux detection principle at a detection portion of the target bus bar.

The sensor unit 6 is configured from a coreless magnetic field detecting sensor that does not include a flux-concentrating core. Such a magnetic field detecting sensor is configured by including various types of magnetic detection elements such as a hall element, a magneto-resistive (MR) element, and a magneto-impedance (MI) element, for example. As shown in FIG. 2, such a magnetic detection element is arranged near the bus bar 2 without a flux-concentrating core included in the periphery. Also, in addition to the exclusion of such a flux-concentrating core, the sensor unit 6 does not include a shield with respect to an external magnetic field other than a magnetic field generated by the detection-targeted bus bar 2 (target bus bar 3). In the present embodiment, the sensor unit 6 is configured as an integrated circuit (IC) chip that integrates a hall element and a buffer amplifier that at least applies impedance conversion to an output of the hall element. The sensor unit 6 configured by the IC chip is mounted on a substrate 6a and arranged near the bus bar 2, as shown in FIG. 3, in the present embodiment. Although omitted from FIGS. 2 and 3, the substrate 6a and the control unit are coupled to each other by a power wire that drives the sensor unit 6 and a signal wire that transmits a detection value of the sensor unit 6.

In the present embodiment, the IC chip serving as the sensor unit 6 has a configuration in which a magnetic flux parallel to a chip surface of the IC chip, in this case, a magnetic flux parallel to an extended surface located on the long side of the cross section of the bus bar 2 can be detected as shown in FIGS. 2 and 3. That is, the sensor unit 6 is configured so as to detect a magnetic flux density B of a predetermined magnetic flux detection direction S. Because the current flowing through the bus bar 2 is an alternating current, the magnetic flux detection direction S includes two directions that are opposite to each other as shown in FIGS. 2 and 3. That is, the magnetic flux detection direction S is a direction parallel to a straight line, and includes both a direction that heads toward one end side of the straight line and a direction that heads toward the other end side of the straight line. In order to facilitate understanding, FIG. 3 illustrates a magnetic line H in a case where a current I heads from the back side of the paper toward the front side of the paper, and shows the magnetic flux density B in such case. As described above, the sensor unit 6 detects the magnetic flux density B of the predetermined magnetic flux detection direction S. Therefore, in the periphery of a detection portion 3s of the target bus bar 3, the sensor unit 6 is arranged so that the magnetic flux detection direction S and a detection portion extending direction L that is the extending direction of the target bus bar 3 at the detection portion 3s achieve an orthogonal state. In the present specification and within the scope of the appended claims, the orthogonal state allows a deviation from orthogonal of ±45° or less. Moreover, a plane that is parallel to the detection portion extending direction L and that includes the magnetic flux detection direction S is referred to as a magnetic flux detection plane P.

As described above, the sensor unit 6 detects the current I (II) flowing through the target bus bar 3, and detects the magnetic flux density 13 of the magnetic field H generated due to the flow of the current I. Naturally, closer to the bus bar 2 the magnetic field becomes stronger and the magnetic flux density B also becomes larger, and therefore, the sensor unit 6 is arranged near the bus bar 2. In other words, the sensor unit 6 is arranged in the periphery of the bus bar 2, and more specifically, the sensor unit 6 is arranged at one location in the entire periphery surrounding the cross section of the bus bar 2 as shown in FIG. 3. As long as a temperature resistance performance, a vibration resistance performance, and the like are satisfied, the sensor unit 6 may be arranged in contact with the bus bar 2. In the present embodiment, as shown in FIGS. 2 and 3, the sensor unit 6 is arranged separated from the bus bar 2 by a predetermined distance (h), so that a detection center location coincides with the general center on the long side of the cross section of the bus bar 2. Here, the predetermined distance (h) is set within a distance in which the sensor unit 6 is capable of detecting a magnetic field generated by the bus bar 2. For example, the distance is set to 0.1 to 30 mm, preferably, 0.5 to 10 mm. Also, the sensor unit 6 is arranged so that the magnetic flux detection direction S and the detection portion extending direction L are in an orthogonal state. Note that the "orthogonal state" is a crossed state that allows a deviation from orthogonal of ±45° or less. In the present embodiment, the sensor unit 6 is arranged so that the magnetic flux detection direction S and the detection portion extending direction L are orthogonal. Because the extending direction L of the bus bar 2 corresponds to the flowing direction of the current I, a strong magnetic flux is obtained at the sensor unit 6. As shown in FIG. 3, h is the distance from the center of the target bus bar 3 (the center of the current I) to the center of the sensor unit 6 (the center of the hall element), and W is the length on the long side of the cross section of the bus bar 2 (the side facing the sensor unit 6). When the current I [A] flows through the bus bar 2, the magnetic flux density B [T=Wb/m²] at the center of the sensor unit 6 is expressed by the following formula with space permeability set as $\mu_0$ [H/m=Wb/A·m].

Formula 1

$$B[T] = \frac{\mu_0 \cdot I}{2(W + 2h)} \quad (1)$$

Next, a layout configuration of a plurality of bus bars 2 with respect to the sensor unit 6 will be explained. As described above, the sensor units 6U, 6V, and 6W of the current detection device 1 detect the magnetic flux of the magnetic field generated by the current I flowing through each of the detection-targeted phase bus bars 2U, 2V, and 2W. In this case, the phase bus bars 2U, 2V, and 2W are arranged in parallel. Thus, the sensor unit 6 of one phase may detect not only the magnetic flux density of the magnetic field H generated by the corresponding phase bus bar 2 (target bus bar 3), but also the magnetic flux of the magnetic field generated from the bus bar 2 of another phase. For example, in a case where the V-phase bus bar 2V is arranged sandwiched on both sides between the U-phase bus bar 2U and the W-phase bus bar 2W, although the V-phase sensor unit 6V should detect only the magnetic flux density of the current flowing through the V-phase bus bar 2V, the V-phase sensor unit 6V may also detect the magnetic flux densities of the currents flowing through the U-phase bus bar 2U and the W-phase bus bar 2W. In this case, the current value of the V-phase bus bar 2V detected by the V-phase sensor unit 6V includes an error due to the detection of the magnetic flux densities of the magnetic fields generated by the U-phase bus bar 2U and the W-phase bus bar 2W. In order to enhance the detection accuracy of the current value detected by the sensor units 6U, 6V, and 6W, it is necessary to use a configuration in which the bus bar 2 as the target bus bar 3 is less susceptible to the effect of the magnetic field of another bus bar 2 (adjacent bus bar 4).

Figure 4:
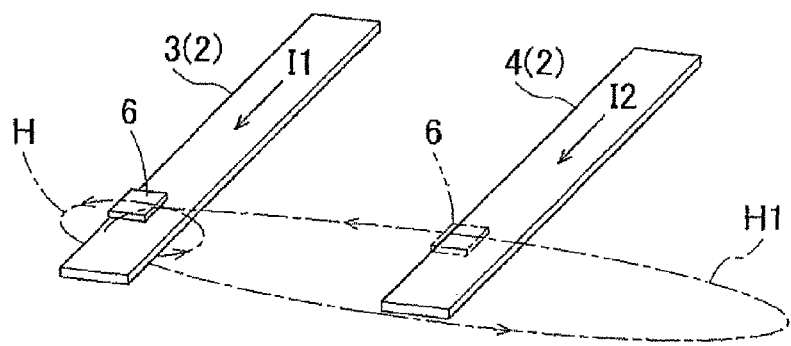
FIG. 4 is a perspective view showing an effect of a current flowing through an adjacent bus bar.
Figure 5:
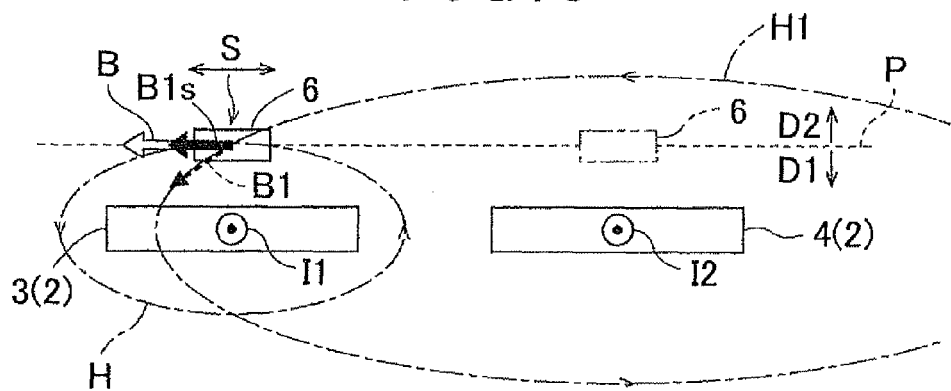
FIG. 5 is a cross-sectional view showing the effect of the current flowing through the adjacent bus bar.

FIGS. 4 and 5 are explanatory views showing an effect of a magnetic field H1 of the adjacent bus bar 4 with respect to the detection of the magnetic flux density B for the target bus bar 3. Here, in order to facilitate the distinction between the target bus bar 3 and the adjacent bus bar 4, the sensor unit 6 is arranged only for the bus bar 2 serving as the target bus bar 3 in the drawings. The explanation below does not particularly concern differences between the U-phase bus bar 2U, the V-phase bus bar 2V, and the W-phase bus bar 2W. The configuration is thus simplified in order to facilitate understanding, and the explanation assumes that both the target bus bar 3 and the adjacent bus bar 4 are arranged in parallel. Naturally, any of the bus bars 2U, 2V, and 2W may be the target bus bar 3 because the bus bars 2U, 2V, and 2W all include the sensor unit 6. Also, a bus bar 2 arranged adjacent to one target bus bar 3 among the plurality of bus bars 2 is the adjacent bus bar 4.

As shown in FIG. 5, the magnetic field H1 generated by a current I2 flowing through the adjacent bus bar 4 has a magnetic flux density of a vector quantity B1 at the sensor unit 6 of the target bus bar 3. As described above, the sensor unit 6 detects the magnetic flux of the predetermined magnetic flux detection direction S. Thus, among magnetic flux densities B1, a magnetic flux density B1s of a vector quantity along the magnetic flux detection direction S due to vector decomposition affects the sensor unit 6 of the target bus bar 3. That is, the magnetic flux density B1s is a disturbance magnetic flux density causing magnetic interference. In the current detection device 1 according to the present invention, the disturbance magnetic flux density due to the current I2 flowing through the adjacent bus bar 4 is suppressed, and the magnetic flux density B of the target bus bar 3 is detected with high accuracy by appropriately setting the geometric relationship of shape, arrangement, orientation, and the like of the adjacent bus bar 4 with respect to the sensor unit 6 and the detection portion 3s of the target bus bar 3. That is, setting the geometric relationship of the adjacent bus bar 4 with respect to the sensor unit 6 and the detection portion 3s of the target bus bar 3 in order to detect the magnetic flux density B with high accuracy is a characteristic of the present invention.

FIRST CONFIGURATION EXAMPLE

Figure 6:
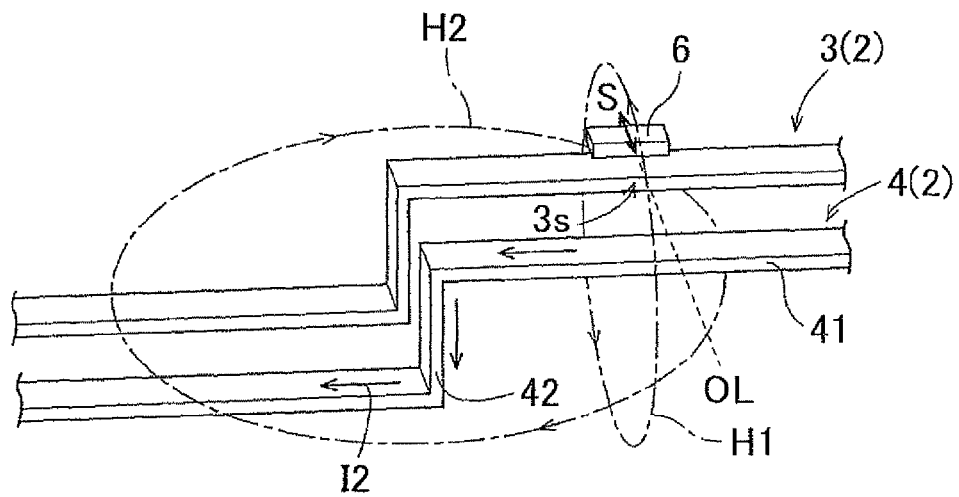
FIG. 6 is a perspective view showing the target bus bar and the adjacent bus bar of a first configuration example.
Figure 7:
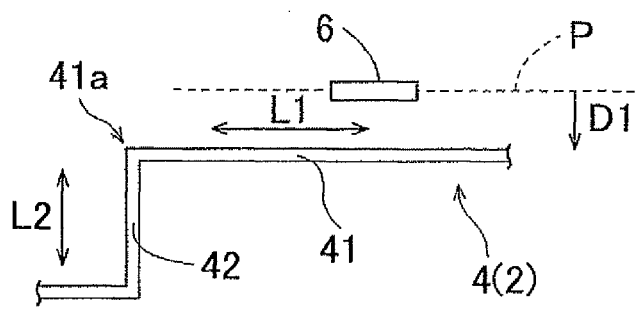
FIG. 7 is a view showing a relationship between the adjacent bus bar and a magnetic flux detection plane in the first configuration example.
Figure 8:
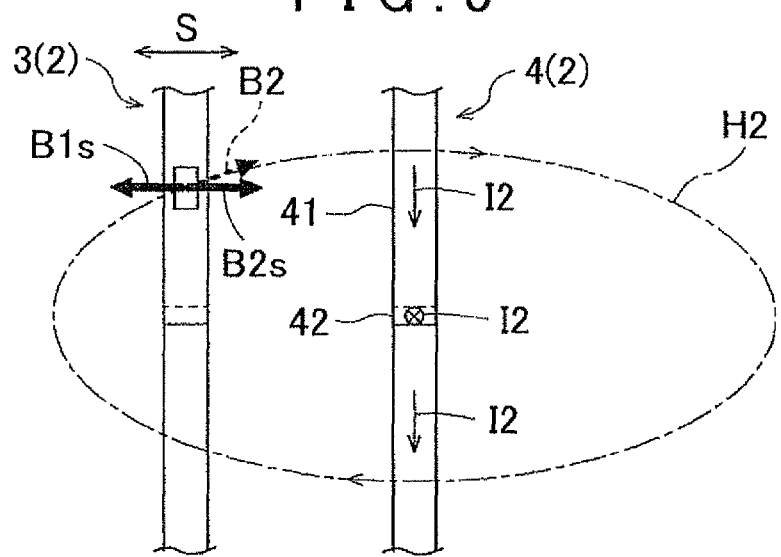
FIG. 8 is a vector diagram showing a suppression effect of a disturbance magnetic flux density in the first configuration example.

A first configuration example will be explained with reference to FIGS. 6 to 8. FIG. 6 is a perspective view showing a positional relationship between the target bus bar 3 and the adjacent bus bar 4. FIG. 7 is a side view of FIG. 6 as seen from the front side of the paper, and shows the shape of the adjacent bus bar 4 with respect to the magnetic flux detection plane P. FIG. 8 is a top view of FIG. 6 as seen from the top edge side of the paper, and is a vector analysis diagram showing a suppression effect of a disturbance magnetic flux density (for example, the magnetic flux density B1s described above).

The adjacent bus bar 4 is configured by including a first extending section 41 and a second extending section 42 extending in different directions. The first extending section 41 is arranged on a first direction D1 side that is on one side of the orthogonal direction with respect to the magnetic flux detection plane P, and extends in a first extending direction L1 parallel to the magnetic flux detection plane P. The second extending section 42 is bent at one end portion 41a of the first extending section 41 in the first extending direction L1 toward the first direction D1 side, and extends in a second extending direction L2 that crosses the magnetic flux detection plane P. Also, the detection portion 3s of the target bus bar 3 is set at an overlapping location OL that overlaps with the first extending section 41 of the adjacent bus bar 4 in the first extending direction L1. That is, the layout is such that the adjacent bus bar 4 includes in the first extending direction L1 at least a portion in which the detection portion 3s of the target bus bar 3 and the first extending section 41 of the adjacent bus bar 4 are at the same position. In other words, when seen from the orthogonal direction with respect to the first extending direction L1, there exists a point at which the detection portion 3s of the target bus bar 3 and the first extending section 41 of the adjacent bus bar 4 overlap each other. In the present example, as shown in FIGS. 6 and 7, the extending section including the detection portion 3s of the target bus bar 3 and the first extending section 41 of the adjacent bus bar 4 overlap each other in the first extending direction L1 of the adjacent bus bar 4.

In order to facilitate understanding, in the present example, the extending direction of the second extending section 42 (second extending direction L2) is orthogonal to the magnetic flux detection plane P. A plane where a magnetic field H2 generated by the flowing current I2 spreads at one point of the second extending section 42 is basically parallel to the magnetic flux detection plane P. A plane where the magnetic field H2 spreads also spreads (inclines) to some extent in the second extending direction L2. Thus, as shown in FIG. 8, the magnetic field H2 generated by the current I2 flowing through the second extending section 42 has a magnetic flux density of a vector quantity B2 at the sensor unit 6 of the target bus bar 3. As described above, the sensor unit 6 detects the magnetic flux of the predetermined magnetic flux detection direction S. Thus, among the magnetic flux densities B2, a magnetic flux density B2s of a vector quantity along the magnetic flux detection direction S due to vector decomposition affects the sensor unit 6 of the target bus bar 3. As shown in FIG. 8, the magnetic flux density B2s is a vector quantity having a 180° different direction with respect to the disturbance magnetic flux density B1s. Thus, the disturbance magnetic flux density B1s is canceled out by the magnetic flux density B2s. That is, the effect of the magnetic field from the adjacent bus bar 4 is suppressed, and the current I1 (I) of the target bus bar 3 can be detected with high accuracy.

As for the specific layout position of the sensor unit 6, it is preferable to experimentally obtain a position where the magnetic flux density detected by the sensor unit 6 is at its smallest when the current I2 is applied to the adjacent bus bar 4 and the current I1 is not applied to the target bus bar 3, for example. In this case, if the magnetic flux density detected by the sensor unit 6 is zero, the effect of the adjacent bus bar 4 on the sensor unit 6 can be completely eliminated. However, it should be noted that the purpose of the present invention can be sufficiently achieved even by largely suppressing, rather than completely eliminating, the effect of the adjacent bus bar 4. The same is true for other configuration examples shown below.

SECOND CONFIGURATION EXAMPLE

Figure 9:
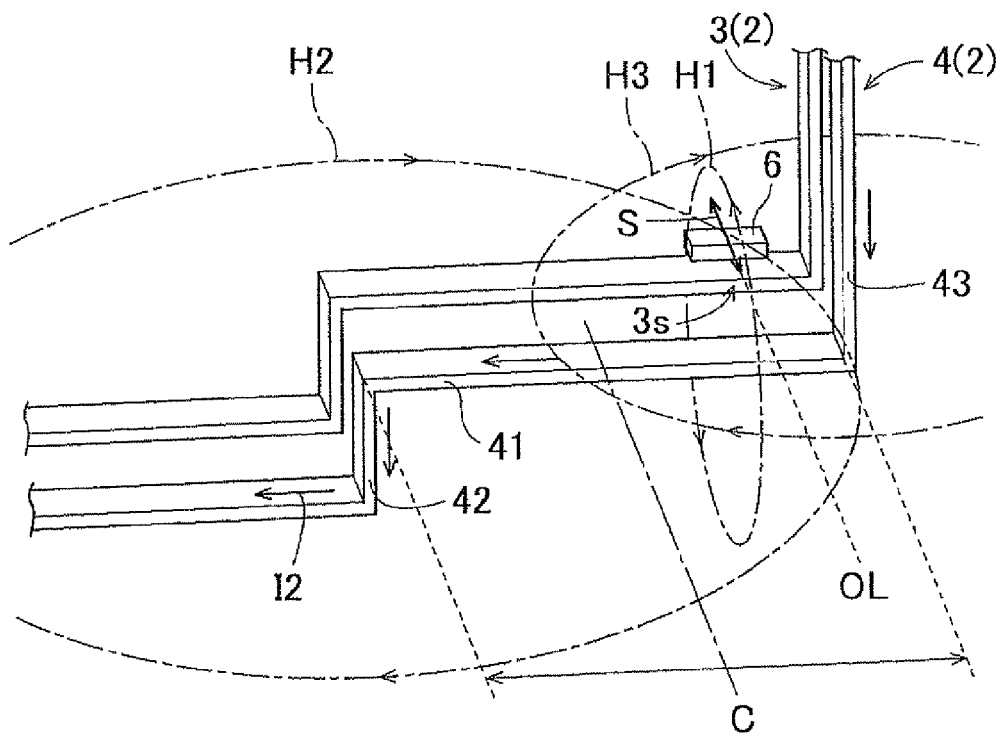
FIG. 9 is a perspective view showing a target bus bar and an adjacent bus bar of a second configuration example.
Figure 10:
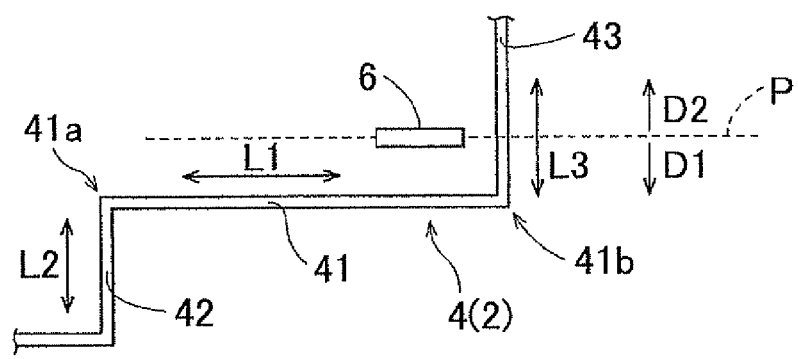
FIG. 10 is a side view showing a relationship between the adjacent bus bar and a magnetic flux detection plane in the second configuration example.
Figure 11:
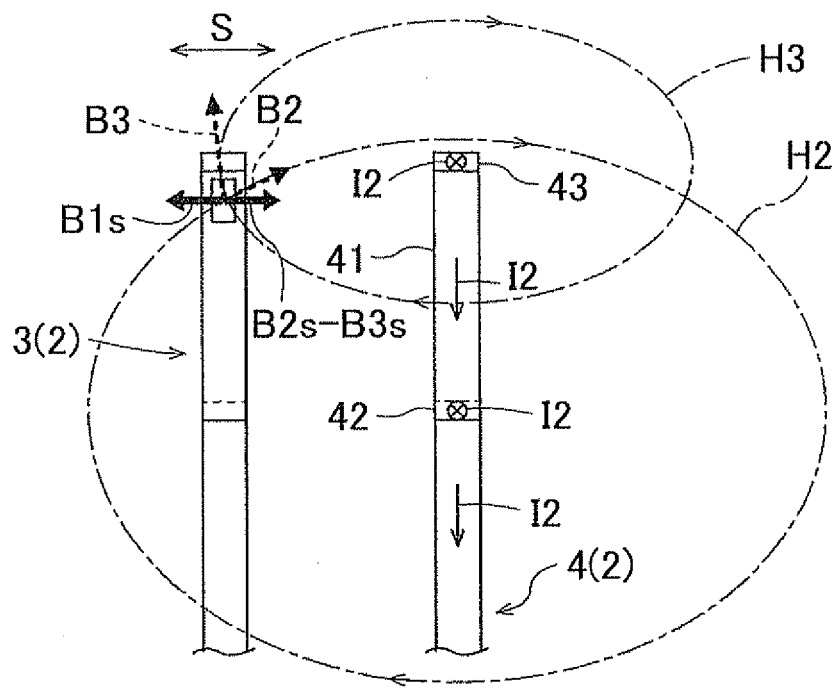
FIG. 11 is a vector diagram showing a suppression effect of a disturbance magnetic flux density in the second configuration example.
Figure 12:
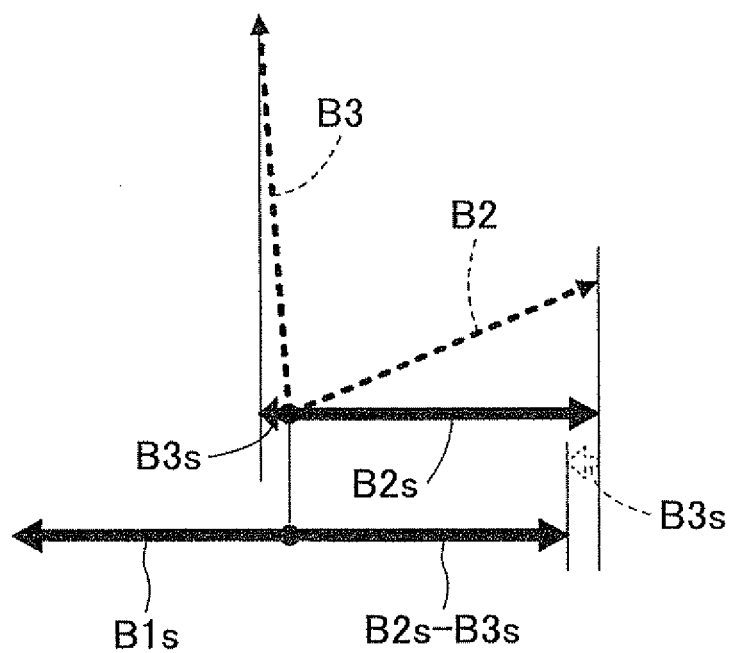
FIG. 12 is an enlarged view of the vector diagram of FIG. 11.

A second configuration example will be explained with reference to FIGS. 9 to 12. FIG. 9 is a perspective view showing a positional relationship of the target bus bar 3 and the adjacent bus bar 4. FIG. 10 is a side view of FIG. 9 as seen from the front side of the paper, and shows the shape of the adjacent bus bar 4 with respect to the magnetic flux detection plane P. FIG. 11 is a top view of FIG. 9 as seen from the top edge side of the paper, and is a vector analysis diagram showing a suppression effect of a disturbance magnetic flux density (for example, the magnetic flux density B1s described above). FIG. 12 is an enlarged view of the vector analysis diagram of FIG. 11.

The adjacent bus bar 4 is configured by including a third extending section 43 in addition to the two extending sections (the first extending section 41 and the second extending section 42 extending in different directions) described in the first configuration example. As described above, the second extending section 42 is bent at the one end portion 41a of the first extending section 41 in the first extending direction L1 toward the first direction D1 side. The third extending section 43 is bent at another end portion 41b of the first extending section 41 in the first extending direction L1 toward a second direction D2 side that is on the other side of the orthogonal direction with respect to the magnetic flux detection plane P, and extends in a third extending direction L3 that crosses the magnetic flux detection plane P. If the first extending direction L1 and the second extending direction L2 of the second extending section 42 are orthogonal, and the first extending direction L1 and the third extending direction L3 of the third extending section 43 are orthogonal, the second extending direction L2 and the third extending direction L3 are parallel. The second extending direction L2 and the third extending direction L3 extend in 180° inverse directions, starting from the end portions 41a and 41b, respectively.

Similar to the first configuration example, the detection portion 3s of the target bus bar 3 is set at the overlapping location OL that overlaps with the first extending section 41 in the first extending direction L1 of the adjacent bus bar 4. However, in the second configuration example, the overlapping location OL is arranged on the third extending section 43 side of a center location C of the first extending section 41 in the first extending direction.

In order to facilitate understanding, in the present example, the extending directions (the second extending direction L2 and the third extending direction L3) of the second extending section 42 and the third extending section 43 are orthogonal to the magnetic flux detection plane P. Planes where the magnetic field H2 and a magnetic field H3 generated by the current I2 flowing through the second extending section 42 and the third extending section 43 spread are both basically parallel to the magnetic flux detection plane P, and also spread to some extent in the second extending direction L2 and the third extending direction L3. Similar to the first configuration example, the effect of the magnetic fields H2 and H3 generated by the current flowing through both extending sections 42 and 43 on the sensor unit 6 of the target bus bar 3 is considered with reference to the vector diagram on the same plane as shown in FIGS. 11 and 12.

As described above, the detection portion 3s of the target bus bar 3 is arranged on the side closer to the third extending section 43. Thus, the distance from the center of the magnetic field H2 generated by the current I2 flowing through the second extending section 42 to the sensor unit 6 is longer than the distance from the center of the magnetic field H3 generated by the current I2 flowing through the third extending section 43 to the sensor unit 6. The magnetic field H2 has a magnetic flux density of a vector quantity B2 at the sensor unit 6 of the target bus bar 3 as shown in FIGS. 11 and 12. The direction of the magnetic flux density B2 more closely approaches the magnetic flux detection direction S compared to the first configuration example as the distance from the center of the magnetic field H2 to the sensor unit 6 becomes larger. Thus, the proportion of the vector component B2s along the magnetic flux detection direction S obtained by vector decomposition increases. A larger distance to the sensor unit 6 is accompanied by a decreased magnitude of the magnetic flux density B2, but the decreased amount is compensated by the increase in the proportion of the vector component B2s along the magnetic flux detection direction S.

The distance from the center of the magnetic field H3 generated by the current I2 flowing through the third extending section 43 to the sensor unit 6 is smaller than the distance from the center of the magnetic field H2. Thus, the magnetic field H3 has a magnetic flux density B3 of a vector quantity that is larger than the magnetic flux density I32 of the magnetic field H2 at the sensor unit 6 of the target bus bar 3 as shown in FIGS. 11 and 12. Also, the direction of a vector component B3s along the magnetic flux detection direction S of the magnetic flux density B3 is the same as the direction of the vector component B1s of the magnetic flux density B1 of the magnetic field H1 generated by the current I2 flowing through the first extending section 41. This increases the disturbance magnetic flux density (B1s), or decreases the vector component B2s of the magnetic flux density B2 that cancels out the disturbance magnetic flux density (B1s). However, because the sensor unit 6 is arranged on the side closer to the third extending section 43, an angle formed by the vector direction of the magnetic flux density B3 and the magnetic flux detection direction S is substantially perpendicular. Thus, even if the absolute value of the magnetic flux density B3 becomes large, the magnitude of the vector component B3s along the magnetic flux detection direction S becomes small. This accordingly reduces the effect on the vector component B1s of the magnetic flux density B1 that is the main component of the disturbance magnetic flux density and the vector component B2s of the magnetic flux density I32 that cancels out the vector component B1s.

As shown in the enlarged vector analysis diagram of FIG. 12, the vector component B1s of the magnetic flux density B1 that is the main component of the disturbance magnetic flux density is satisfactorily suppressed by the vector component (B2s-B3s) along the magnetic flux detection direction S of a composite vector of the magnetic flux densities B2 and B3. That is, the effect of the magnetic field from the adjacent bus bar 4 is suppressed, and the current I1 (I) of the target bus bar 3 can be detected with high accuracy.

THIRD CONFIGURATION EXAMPLE

Figure 13:
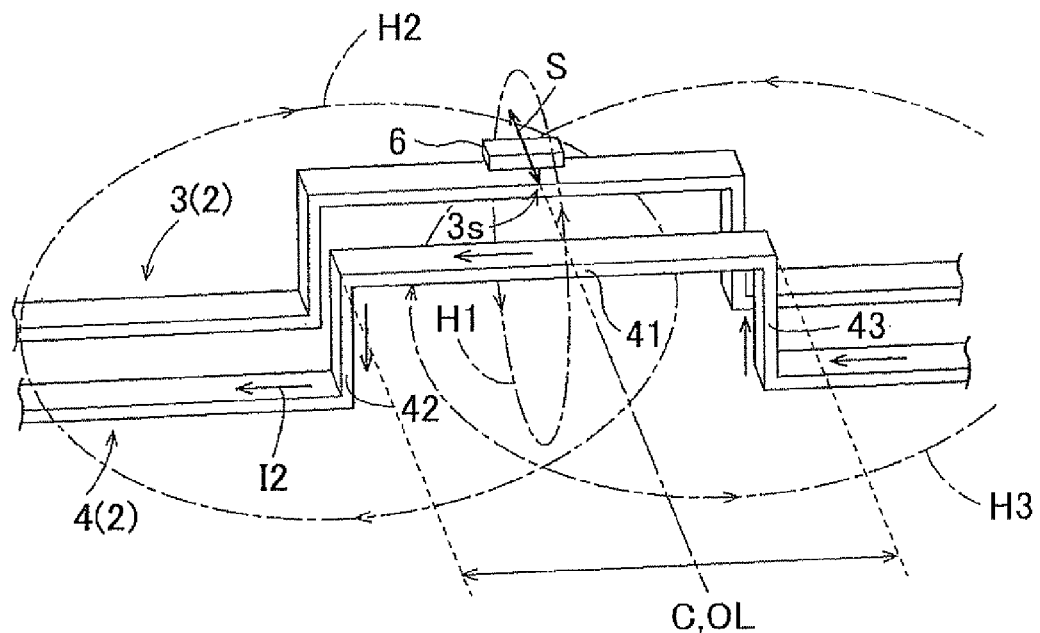
FIG. 13 is a perspective view showing a target bus bar and an adjacent bus bar of a third configuration example.
Figure 14:
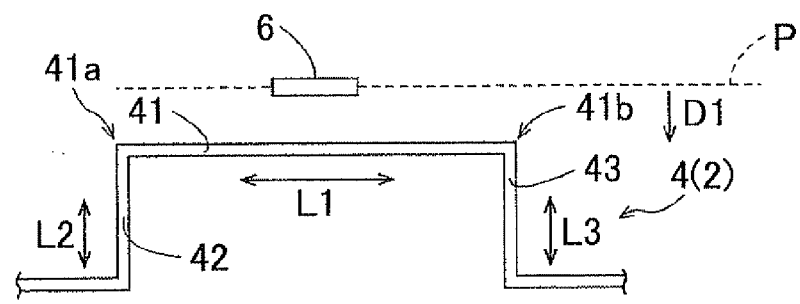
FIG. 14 is a side view showing a relationship between the adjacent bus bar and a magnetic flux detection plane in the third configuration example.
Figure 15:
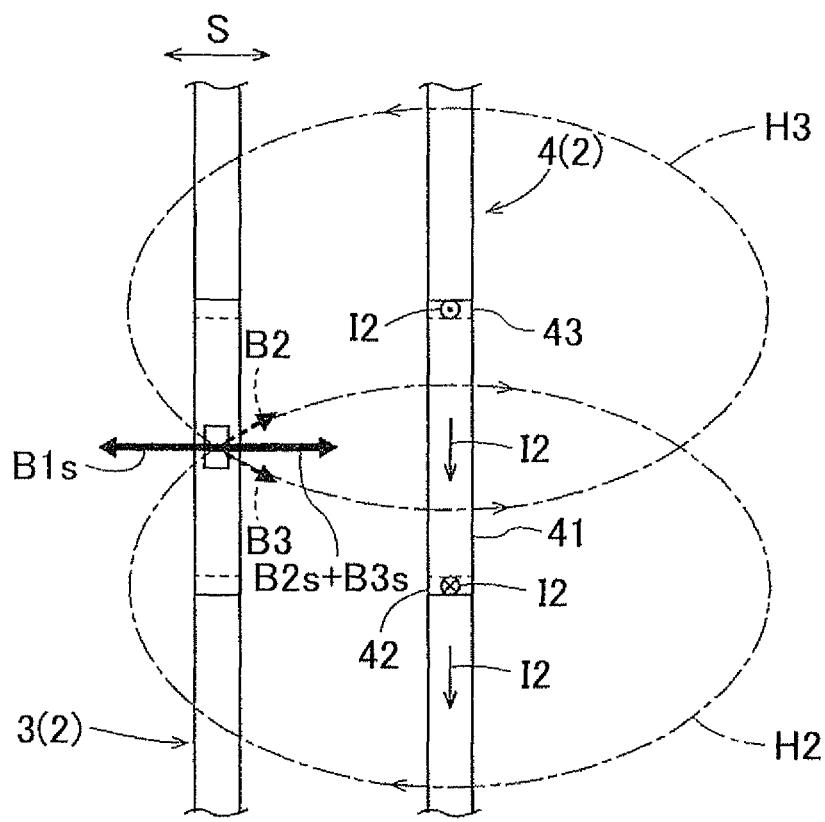
FIG. 15 is a vector diagram showing a suppression effect of a disturbance magnetic flux density in the third configuration example.
Figure 16:
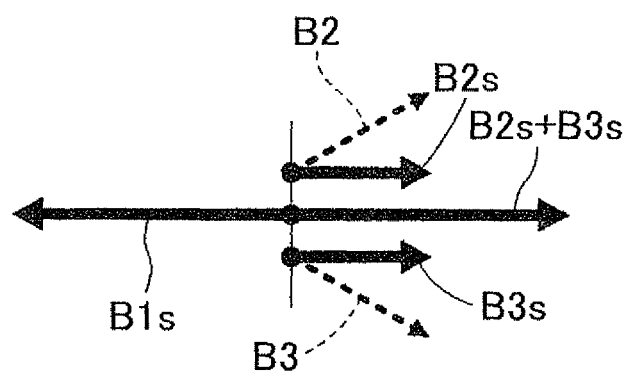
FIG. 16 is an enlarged view of the vector diagram of FIG. 15.

A third configuration example will be explained with reference to FIGS. 13 to 16. FIG. 13 is a perspective view showing a positional relationship between the target bus bar 3 and the adjacent bus bar 4. FIG. 14 is a side view of FIG. 13 as seen from the front side of the paper, and shows the shape of the adjacent bus bar 4 with respect to the magnetic flux detection plane P. FIG. 15 is a top view of FIG. 13 as seen from the top edge side of the paper, and is a vector analysis diagram showing a suppression effect of a disturbance magnetic flux density (for example, the magnetic flux density B1s described above). FIG. 16 is an enlarged view of the vector analysis diagram of FIG. 15.

In the third configuration example, the adjacent bus bar 4 is configured by including the third extending section 43 in addition to the two extending sections (the first extending section 41 and the second extending section 42 extending in different directions) described in the first configuration example. The third extending section 43 extends in a direction different from that in the second configuration example. As described above, the second extending section 42 is bent at the one end portion 41a of the first extending section 41 in the first extending direction L1 toward the first direction D1 side.

The third extending section 43 is bent at the other end portion 41b of the first extending section 41 in the first extending direction L1 toward the first direction D1 side similar to the second extending section 42, and extends in the third extending direction L3 that crosses the magnetic flux detection plane P. If the first extending direction L1 and the second extending direction L2 of the second extending section 42 are orthogonal, and the first extending direction L1 and the third extending direction L3 of the third extending section 43 are orthogonal, the second extending direction L2 and the third extending direction L3 are parallel, and they extend in the same direction starting from the end portions 41a and 41b.

Similar to the first configuration example, the detection portion 3s of the target bus bar 3 is set at the overlapping location OL that overlaps with the first extending section 41 in the first extending direction L1 of the adjacent bus bar 4. However, in the third configuration example, the overlapping location OL is arranged at the center location C of the first extending section 41 in the first extending direction. Naturally, the center location does not have to be the exact center, and can be within a range of a practical tolerance that considers the dimensional tolerance of the bus bar 2, the dimensional tolerance of an IC chip configuring the sensor unit 6, the dimensional tolerance of the substrate 6a on which the IC chip is mounted, the relative assembly tolerance of the substrate 6a and the bus bar 2, and the like.

In order to facilitate understanding, in the present example, the extending directions (the second extending direction L2 and the third extending direction L3) of the second extending section 42 and the third extending section 43 are in an orthogonal state with respect to the magnetic flux detection plane P. The planes where the magnetic fields H2 and H3 generated by the current I2 flowing through the second extending section 42 and the third extending section 43 spread are both basically parallel to the magnetic flux detection plane P, and also spread to some extent in the second extending direction L2 and the third extending direction L3. Similar to the first configuration example and the second configuration example, the effect of the magnetic fields H2 and H3 generated by the current flowing through both the extending sections 42 and 43 on the sensor unit 6 of the target bus bar 3 is considered with reference to the vector diagram on the same plane as shown in FIGS. 15 and 16.

As described above, the overlapping location OL is arranged at the center location C of the first extending section 41 in the first extending direction. Thus, the distance from the center of the magnetic field H2 generated by the current I2 flowing through the second extending section 42 to the sensor unit 6 is substantially the same as the distance from the center of the magnetic field H3 generated by the current I2 flowing through the third extending section 43 to the sensor unit 6. Thus, the absolute value of the magnetic flux density B2 of the magnetic field H2 at the sensor unit 6 of the target bus bar 3 and the absolute value of the magnetic flux density B3 of the magnetic field H3 become substantially the same. Also, at the sensor unit 6, the direction of the vector components B2s and B3s along the magnetic flux detection direction S of the magnetic flux densities B2 and B3 is a direction opposite to the direction of the vector component B1s of the magnetic flux density B1 of the magnetic field H1 generated by the current I2 flowing through the first extending section 41.

Thus, the vector component (B2s+B3s) along the magnetic flux detection direction S of the composite vector of the magnetic flux density B2 and the magnetic flux density B3 is a magnetic flux density in a direction that cancels out the vector component B1s (disturbance magnetic flux density) along the magnetic flux detection direction S of the magnetic flux density B1. As shown in the enlarged vector analysis diagram of FIG. 16, the vector component B1s of the magnetic flux density B1 that is the main component of the disturbance magnetic flux density is satisfactorily suppressed by the vector component (B2s+B3s) along the magnetic flux detection direction S of the composite vector of the magnetic flux densities B2 and B3. That is, the effect of the magnetic field from the adjacent bus bar 4 is suppressed, and the current I1 (I) of the target bus bar 3 can be detected with high accuracy.

FOURTH CONFIGURATION EXAMPLE

Figure 17:
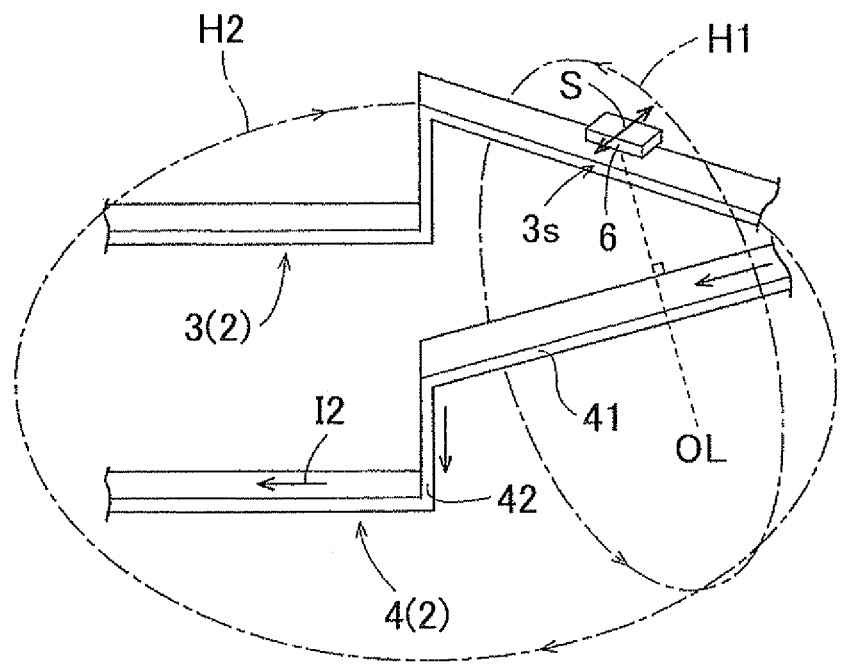
FIG. 17 is a perspective view showing a target bus bar and an adjacent bus bar of a fourth configuration example.

In the configuration examples described above, in order to facilitate understanding, examples in which the target bus bar 3 and the adjacent bus bar 4 are in a substantially parallel state are explained. That is, examples in which the detection portion extending direction L and the first extending direction L1 are parallel to each other are explained. Alternatively, the target bus bar 3 and the adjacent bus bar 4 may be obliquely arranged as shown in the perspective view of FIG. 17 and the top view of FIG. 18. The fourth configuration example corresponds to the first configuration example, and the layout of the target bus bar 3 and the adjacent bus bar 4 is changed from a parallel state to an oblique state. FIG. 17 corresponds to FIG. 6, and FIG. 18 corresponds to FIG. 8.

Figure 18:
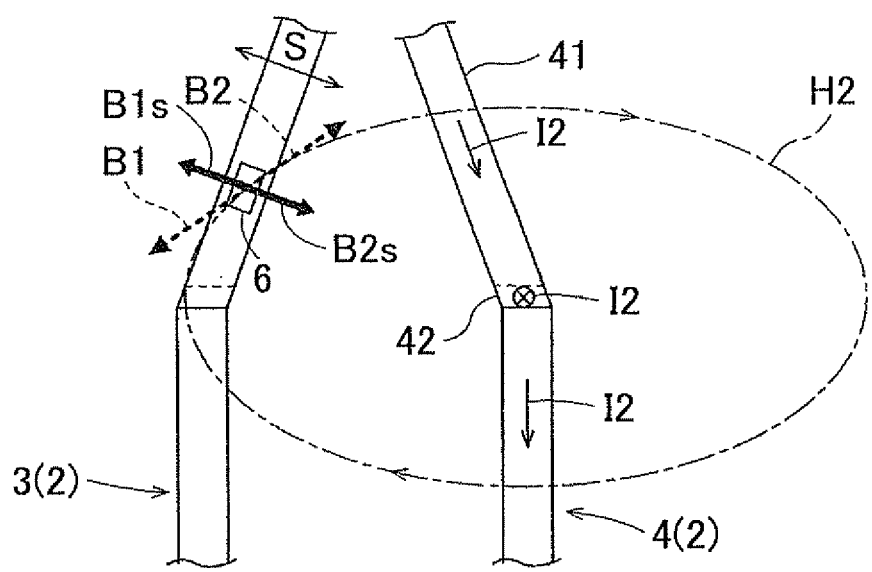
FIG. 18 is a vector diagram showing a suppression effect of a disturbance magnetic flux density in the fourth configuration example.

In the fourth configuration example, the magnetic field H1 generated by the current I2 flowing through the first extending section 41 of the adjacent bus bar 4 also affects the sensor unit 6 as shown in FIG. 18. Although the proportion of vector decomposition is different from the first configuration example because the geometric relationship differs, the vector component B1s along the magnetic flux detection direction S of the magnetic flux density B1 of the magnetic field H1 at the sensor unit 6 is the disturbance magnetic flux density. Likewise, although the proportion of vector decomposition is different from the first configuration example, the vector component B2s along the magnetic flux detection direction S at the sensor unit 6, of the magnetic flux density B2 of the magnetic field H2 generated by the current I2 flowing through the second extending section 42 of the adjacent bus bar 4, is the vector component in the direction suppressing the disturbance magnetic flux density (B1s).

Similar to the above configuration examples, the detection portion 3s of the target bus bar 3 is set at the overlapping location OL that overlaps with the first extending section 41 in the first extending direction L1 of the adjacent bus bar 4. The plane where the magnetic field H1 generated by the current I2 flowing through the first extending section 41 of the adjacent bus bar 4 spreads is a plane that is substantially orthogonal to the first extending direction L1 of the first extending section 41 that is the flowing direction of the current I2. Thus, the overlapping portion OL at which the detection portion 3s of the target bus bar 3 is set falls within a range substantially orthogonal to the first extending direction L1. Even if the target bus bar 3 and the adjacent bus bar 4 are not arranged in a parallel state as described above, the effect of the magnetic field from the adjacent bus bar 4 can be suppressed, and the current I of the target bus bar 3 can be detected with high accuracy. The fourth configuration example is explained using an example that modifies the first configuration example. It is obvious that the second configuration example and the third configuration example may be similarly modified, and detailed descriptions thereof will be omitted here.

OTHER CONFIGURATION EXAMPLES (1) In order to facilitate understanding, the above configuration examples are simplified examples that show only two bus bars 2, namely, the target bus bar 3 and the adjacent bus bar 4. Naturally, the two bus bars may complementarily serve as the target bus bar 3 and the adjacent bus bar 4. If there are three or more bus bars 2, one of the bus bars 2 complementarily serves as the target bus bar 3, and the remaining bus bars 2 serve as the adjacent bus bars 4. If a plurality of adjacent bus bars 4 is adjacent to one target bus bar 3, the relationship between the one target bus bar 3 and the one adjacent bus bar 4 may be considered in two ways. Thus, the present invention is not limited to the above configuration examples that are simplified by having only the two bus bars 2 of the target bus bar 3 and the adjacent bus bar 4. The present invention may also be applied in cases where three or more adjacent bus bars 2 are provided.

(2) The above configuration examples illustrate examples in which the detection portion 3s of the target bus bar 3 is arranged on the first direction D1 side with respect to the magnetic flux detection plane P. However, the present invention is not limited to such a configuration example, and the detection portion 3s of the target bus bar 3 may be arranged on the second direction D2 side with respect to the magnetic flux detection plane P. If the detection portion 3s is arranged on the first direction D1 side with respect to the magnetic flux detection plane P as shown in the first to fourth configuration examples, the target bus bar 3 and the adjacent bus bar 4 are adjacently arranged on one side of the magnetic flux detection plane P. Therefore, a plurality of bus bars 2 can be efficiently arranged. However, efficient layouts differ depending on the device using the plurality of bus bars 2. Therefore, the present invention is not limited to the above configuration examples, and the detection portion 3s may be arranged on the second direction D2 side with respect to the magnetic flux detection plane P.

(3) The above configuration examples illustrate examples in which the shapes of the plurality of bus bars are identical or symmetrical. However, the shapes of the bus bars need not be identical or symmetrical, and obviously may be different from one another.

The present invention can be applied to a current detection device that detects a current flowing through a conductor by using a hall effect. For example, the present invention can be applied to a current detection device that detects a current flowing through a bus bar that couples a polyphase alternating current rotary electric machine and a driving circuit.

What is claimed is:

1. A current detection device that detects a current flowing through a target bus bar based on a magnetic flux in the periphery of the target bus bar, the target bus bar being at least one of a plurality of bus bars arranged in parallel, wherein
    a sensor unit that detects a magnetic flux in a predetermined magnetic flux detection direction and includes no flux-concentrating core that orbits around the target bus bar, the sensor unit being arranged near a detection portion of the target bus bar so that the magnetic flux detection direction and a detection portion extending direction that is an extending direction of the target bus bar at the detection portion achieve an orthogonal state,
    a plane that is parallel to the detection portion extending direction and includes the magnetic flux detection direction is a magnetic flux detection plane, and a bus bar arranged adjacent to the target bus bar among the plurality of bus bars is an adjacent bus bar,
    the adjacent bus bar is configured by including a first extending section that is arranged on a first direction side on one side of an orthogonal direction with respect to the magnetic flux detection plane, and extends in a first extending direction parallel to the magnetic flux detection plane, and a second extending section that is bent at one end portion of the first extending section in the first extending direction toward the first direction side, and extends in a second extending direction that crosses the magnetic flux detection plane, and the detection portion of the target bus bar is set at an overlapping location that overlaps with the first extending section in the first extending direction.

2. The current detection device according to claim 1, wherein the adjacent bus bar further includes a third extending section that is bent at another end portion of the first extending section in the first extending direction toward a second direction side on another side of the orthogonal direction with respect to the magnetic flux detection plane, and extends in a third extending direction that crosses the magnetic flux detection plane, and the overlapping location is arranged on the third extending section side of a center location of the first extending section in the first extending direction.

3. The current detection device according to claim 2, wherein the first extending direction and the second extending direction are orthogonal.

4. The current detection device according to claim 3, wherein each of the plurality of bus bars has an identical shape.

5. The current detection device according to claim 4, wherein the detection portion of the target bus bar is arranged on the first direction side with respect to the magnetic flux detection plane.

6. The current detection device according to claim 2, wherein the detection portion extending direction and the first extending direction are parallel to each other.

7. The current detection device according to claim 5, wherein each of the plurality of bus bars has an identical shape.

8. The current detection device according to claim 6, wherein the detection portion of the target bus bar is arranged on the first direction side with respect to the magnetic flux detection plane.

9. The current detection device according to claim 1, wherein the adjacent bus bar further includes a third extending section that is bent at another end portion of the first extending section in the first extending direction toward the first direction side, and extends in a third extending direction that crosses the magnetic flux detection plane, and the overlapping location is arranged at a center location of the first extending section in the first extending direction.

10. The current detection device according to claim 9, wherein the first extending direction and the second extending direction are orthogonal.

11. The current detection device according to claim 10, wherein each of the plurality of bus bars has an identical shape.

12. The current detection device according to claim 11, wherein the detection portion of the target bus bar is arranged on the first direction side with respect to the magnetic flux detection plane.

13. The current detection device according to claim 9, wherein the detection portion extending direction and the first extending direction are parallel to each other.

14. The current detection device according to claim 13, wherein each of the plurality of bus bars has an identical shape.

15. The current detection device according to claim 14, wherein the detection portion of the target bus bar is arranged on the first direction side with respect to the magnetic flux detection plane.

16. The current detection device according to claim 1, wherein the first extending direction and the second extending direction are orthogonal.

17. The current detection device according to claim 1, wherein the detection portion extending direction and the first extending direction are parallel to each other.

18. The current detection device according to claim 1, wherein each of the plurality of bus bars has an identical shape.

19. The current detection device according to claim 1, wherein the detection portion of the target bus bar is arranged on the first direction side with respect to the magnetic flux detection plane.

* * * * *